(12) United States Patent
Kobayashi et al.

(10) Patent No.: US 12,114,490 B2
(45) Date of Patent: Oct. 8, 2024

(54) SEMICONDUCTOR DEVICE AND METHOD OF FORMING THE SAME

(71) Applicant: MICRON TECHNOLOGY, INC., Boise, ID (US)

(72) Inventors: Naoyoshi Kobayashi, Higashihiroshima (JP); Tsuyoshi Tomoyama, Higashihiorshima (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 190 days.

(21) Appl. No.: 17/558,323

(22) Filed: Dec. 21, 2021

(65) Prior Publication Data
US 2023/0200058 A1  Jun. 22, 2023

(51) Int. Cl.
*H10B 12/00* (2023.01)
(52) U.S. Cl.
CPC ............ *H10B 12/50* (2023.02); *H10B 12/09* (2023.02); *H10B 12/315* (2023.02); *H10B 12/34* (2023.02); *H10B 12/488* (2023.02)
(58) Field of Classification Search
CPC .......... H10B 12/09; H10B 12/50; G11C 8/14; H01L 23/535; H01L 23/485
See application file for complete search history.

(56) References Cited

U.S. PATENT DOCUMENTS

| 2018/0190665 | A1* | 7/2018 | Huang | H10B 12/50 |
| 2019/0206877 | A1* | 7/2019 | Kim | H10B 63/30 |
| 2021/0296237 | A1* | 9/2021 | Kim | H10B 12/053 |
| 2022/0122984 | A1* | 4/2022 | Tung | H10B 12/488 |
| 2023/0005935 | A1* | 1/2023 | Lee | H10B 12/50 |

FOREIGN PATENT DOCUMENTS

| CN | 108257919 B | * | 10/2020 | ......... H01L 23/5226 |
| JP | 2006108510 A | * | 4/2006 | ......... G11C 16/0408 |

* cited by examiner

*Primary Examiner* — Edward Chin
(74) *Attorney, Agent, or Firm* — Dorsey & Whitney LLP

(57) ABSTRACT

An apparatus includes a substrate; a memory cell region provided over the substrate; a peripheral region provided over the substrate and adjacent to the memory cell region; and a plurality of word-lines extending in parallel across the memory cell region and the peripheral region; a first insulating film covering top surfaces of the plurality of word-lines in each of the memory cell region and the peripheral region and covering side surfaces of upper portions of the plurality of word-lines in the peripheral region without covering side surfaces of the upper portions of the plurality of word-lines in the memory cell region.

4 Claims, 17 Drawing Sheets

SEMICONDUCTOR DEVICE AND METHOD OF FORMING THE SAME

BACKGROUND

Further miniaturization is being promoted in semiconductor memory devices, for example, semiconductor memory devices such as a dynamic random access memory (hereinafter referred to as DRAM) in order to increase the data storage capacity. For example, the size of the repetition pitch of wirings such as word-lines of DRAM is reduced, and the distance between the word-lines is also reduced. However, if the diameter of a contact hole to be connected to a word-line is increased during formation of the contact hole, the adjacent word-lines may be short-circuited.

BRIEF DESCRIPTION OF THE DRAWINGS

FIGS. 3A, 4A, 5A and 6A are plan views showing an example of the schematic configuration in the exemplary process stage. FIGS. 3B, 4B, 5B and 6B are longitudinal-sectional views showing schematic configurations of portions along C-C lines of FIGS. 3A, 4A, 5A and 6A. FIGS. 3C, 4C, 5C and 6D are longitudinal-sectional views showing schematic configurations of portion along D-D lines of FIGS. 3A, 4A, 5A and 6A. FIG. 6C is a longitudinal-sectional view showing an enlarged schematic configuration of a region K of FIG. 6B.

FIGS. 7A to 7E are diagrams showing the semiconductor memory device according to the embodiment and a schematic configuration of the method of forming the same, and are diagrams showing an example of the schematic configuration in an exemplary process stage following the process stage shown in FIGS. 6A to 6D. FIGS. 7A and 7B are plan layout views showing a schematic configuration of the memory cell region of the semiconductor memory device according to the embodiment. FIG. 7A corresponds to an enlarged view of the memory mat end region A of FIG. 1B. FIG. 7B corresponds to an enlarged view of the memory mat end region B of FIG. 1B. FIG. 7C is a longitudinal-sectional view showing a schematic configuration of a portion along a C-C line of FIG. 7A and an E-E line of FIG. 7B. FIG. 7D is a longitudinal-sectional view showing a schematic configuration of a portion along a D-D line of FIG. 7A and F-F line of FIG. 7B. FIG. 7E is a longitudinal-sectional view showing a schematic configuration of a portion along a G-G line of FIG. 7A.

DETAILED DESCRIPTION

Figure 1A:
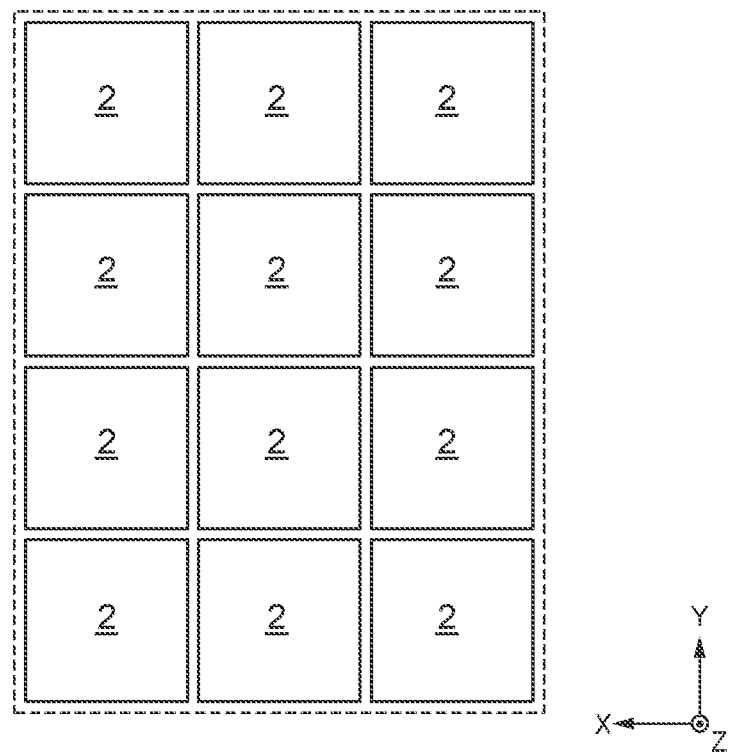
FIG. 1A is a plan view showing a schematic configuration of a part of a memory cell region of a semiconductor memory device according to an embodiment.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Hereinafter, a semiconductor memory device 1 according to an embodiment and a method of forming the same will be described with reference to the drawings. The semiconductor memory device 1 will be described by exemplifying DRAM. In the description of the embodiment, common or related elements or substantially the same elements are designated by the same reference numerals or characters, and the description thereof will be omitted. In Figures, the dimensions and the dimensional ratio of respective parts in each figure do not necessarily match the dimensions and the dimensional ratio of the parts in the embodiment. The dimensions and dimensional ratio of the corresponding parts in the plan view and the longitudinal-sectional view do not necessarily match each other. The up-and-down direction in the following description means an up-and-down direction when the semiconductor substrate 10 is placed on the lower side.

Figure 1B:
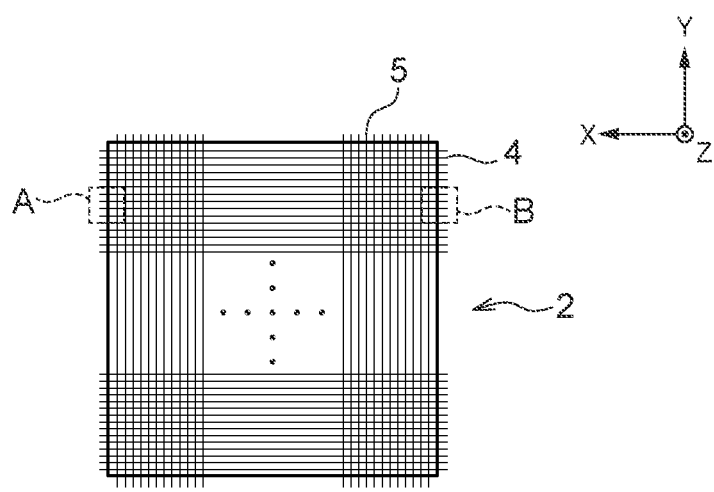
FIG. 1B is a plan view showing a schematic configuration of a memory mat.

FIG. 1A and FIG. 1B are diagrams showing planar layouts of the semiconductor memory device 1 according to the embodiment. As shown in FIG. 1A, the semiconductor memory device 1 includes a plurality of memory mats 2 arranged in a matrix form on the surface of a semiconductor substrate. As shown in FIG. 1B, a plurality of word-lines 4 are arranged in parallel on each memory mat 2 so as to extend in an X direction in the figures. Further, a plurality of bit-lines 5 are arranged in parallel on the memory mat 2 so as to be orthogonal to the word-lines 4, in other words, so as to extend in a Y direction in the figures. The direction parallel to the word-lines 4, in other words, the X direction in the figures is referred to as a word-line direction. The direction parallel to the bit-lines 5, that is, the Y direction in the figures is referred to as a bit-line direction.

Memory mat end regions A and B are arranged at a peripheral portion in the word-line direction of the memory mat 2. The memory mat end region A is located at one end portion in the X direction of the memory mat 2, and the memory mat end region B is located at the other end portion in the X direction of the memory mat 2. Each word-line 4 is connected to a row decoder (not shown) at the peripheral portion thereof.

Each bit-line 5 is connected to a column decoder (not shown) at the peripheral portion thereof. During reading and writing of a memory cell, a column address to be selected is input to the column decoder from a column address buffer (not shown). Each of the plurality of bit-lines 5 is paired with a corresponding one of the plurality of memory cells to control access to a plurality of corresponding memory cells out of the plurality of memory cells.

Figure 2A:
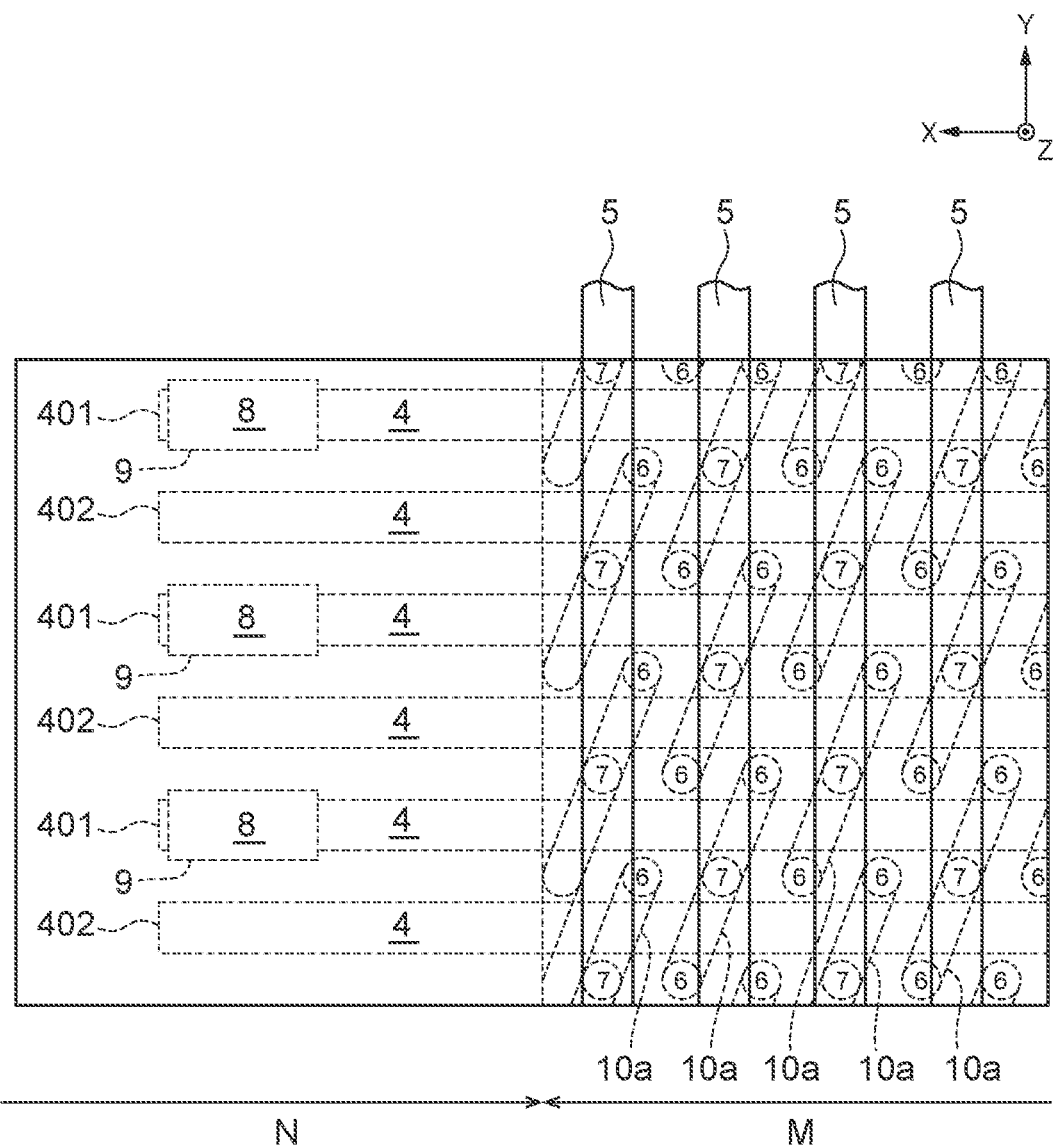
FIG. 2A is a plan layout view showing a schematic configuration of the memory cell region of the semiconductor memory device according to the embodiment, and is an enlarged view of a memory mat end region A of FIG. 1B.
Figure 2B:
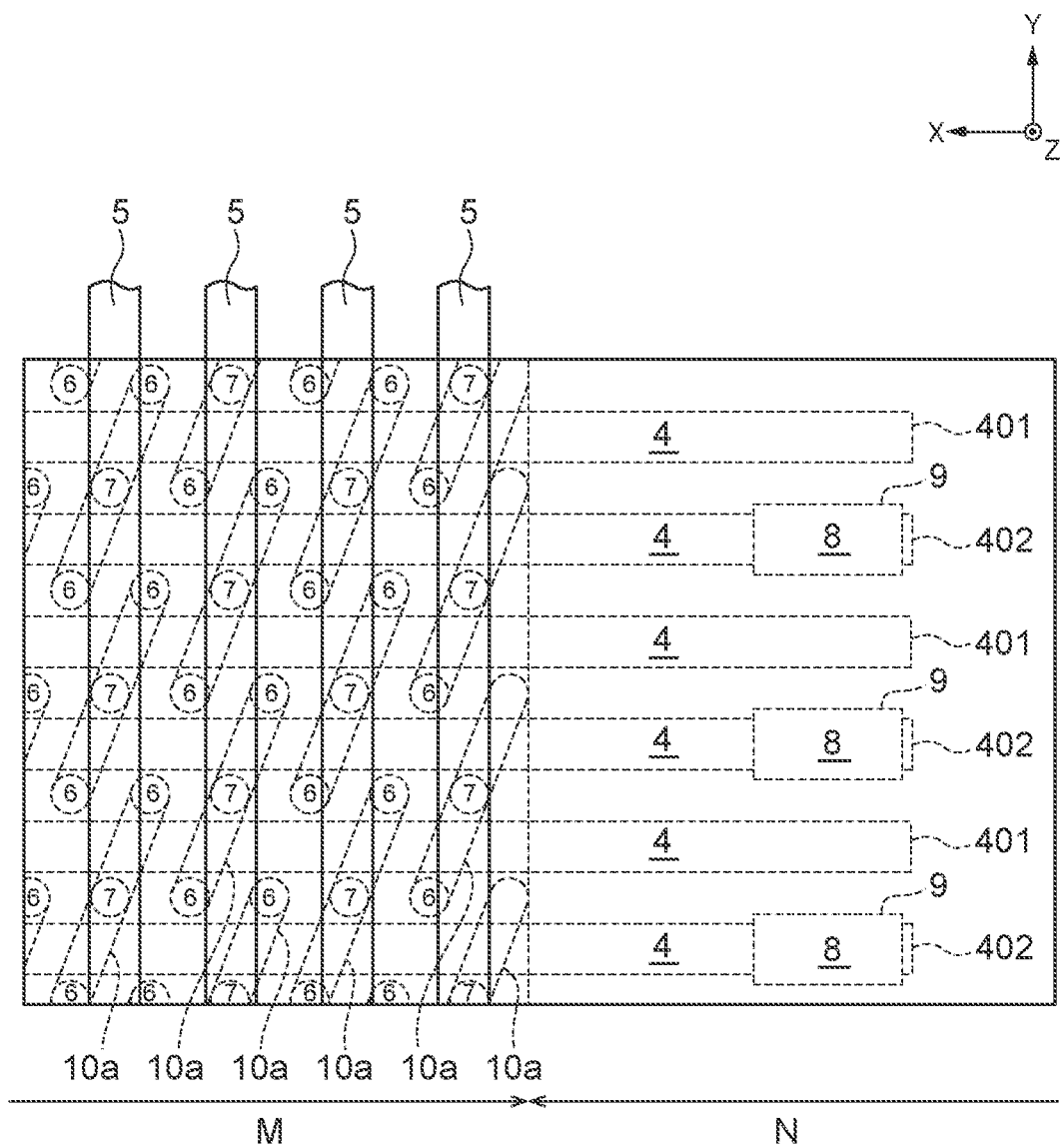
FIG. 2B is a plan layout view showing a schematic configuration of the memory cell region of the semiconductor memory device according to the embodiment, and is an enlarged view of a memory mat end region B of FIG. 1B.

FIG. 2A is a plan layout view showing a schematic configuration in the memory mat end region A of FIG. 1B. FIG. 2B is a plan layout view showing a schematic configuration in the memory mat end region B of FIG. 1B. The layout shown in FIG. 2B is symmetrical to the layout shown in FIG. 2A, and the other configurations are the same. The cross-sectional structure in FIG. 2B is a structure obtained by inverting the longitudinal-sectional structure in FIG. 2A in the X direction. Since the configurations in the memory mat end region A and the memory mat end region B, that is, the configurations in FIG. 2A and FIG. 2B are substantially the same including the cross-sectional structures thereof, the configuration in FIG. 2A will be described below.

As shown in FIG. 2A, in the memory mat end region A, the semiconductor memory device 1 includes a memory cell region M and a peripheral region N. In the memory cell region M, a plurality of word-lines 4 arranged at equal pitches in the Y direction and a plurality of bit-lines 5 arranged at equal pitches in the X direction are arranged orthogonally to each other. A plurality of active regions 10a each constituting a memory cell are arranged at the intersections between the word-lines 4 and the bit-lines 5. Word-line contacts 8 to be connected to the word-lines 4 are arranged in the peripheral region N.

The word-lines 4 extend in the X direction, and the plurality of word-lines 4 are arranged side by side in the Y direction. The plurality of word-lines 4 are arranged in the form of repetition of word-lines 401 and 402. In the memory mat end region A, the word-line contacts 8 are connected to alternate word-lines 4, that is, the first word-lines 401. The word-line contact 8 corresponds to a word contact electrode 24 described later.

A longitudinal direction of the active regions 10a is inclined at a predetermined angle with respect to the bit-lines 5. The word-line 4 functions as a gate electrode of an access transistor of a memory cell provided in the active region 10a. The bit-line 5 is connected to a planar central portion of the active region 10a via a bit-line contact 7. In the active region 10a, a capacitance contact 6 is arranged on the opposite side to the bit-line contact 7 with respect to the word-line 4 with the word-line 4 interposed therebetween. A capacitor is connected to the capacitance contact 6 as described later.

The word-lines 4 are arranged so as to extend linearly from the memory cell region M across the peripheral region N. The word-line contacts 8 which are electrically connected to the word-lines 4 (401) are provided in the peripheral region N. The word-line contacts 8 are connected to the word-lines 4 (401) at edge portions 9 of the word-lines 4. The edge portion 9 corresponds to an overlapping portion between the word-line 4 and the word-line contact 8.

In the peripheral region N, the word-line contacts 8 are connected to alternate word-lines 4 (401). The word-line 4 (402) to which the word-line contact 8 is not connected is arranged adjacent to the word-line 4 (401) to which the word-line contact 8 is connected.

In the memory mat end region A shown in FIG. 2A, each word-line 401 is sandwiched between word-lines 402 adjacent to the word-line 401. Each word-line 402 is sandwiched by word-lines 401 adjacent to the word-line 402. The plurality of word-lines 4 (401, 402) are arranged in order as described above, and they are subsequently arranged so as to repeat this order.

In the memory mat end region A shown in FIG. 2A, if the word-line 401 is defined as an odd-numbered word-line 4 (odd-numbered one), the word-line 402 is defined as an even-numbered word-line 4 (even-numbered one). In this case, the word-line contact 8 is connected to the odd-numbered word-line 4 (odd-numbered one). The word-line contact 8 is not connected to the even-numbered word line 4 (even-numbered one).

The plan layout of the memory mat end region B shown in FIG. 2B is a layout obtained by replacing the arrangement of the word-line contacts 8 with respect to the arrangement in the memory mat end region A. The memory mat end region B has a layout obtained by exchanging the odd-numbered word-lines and the even-numbered word-lines with each other in the memory mat end region A.

In the memory mat end region B shown in FIG. 2B, the word-line contact 8 is connected to the even-numbered word-line 4 (402) (even-numbered ones). The word-line contact 8 is not connected to the odd-numbered word-line 4 (401) (odd-numbered one). The word-lines 402 in the peripheral region N of the memory mat end region A are the word-lines 4 to which the word-line contacts 8 are connected in the memory mat end region B. The other configurations of the memory mat end region B are substantially the same as the configurations of the memory mat end region A.

Figure 8:
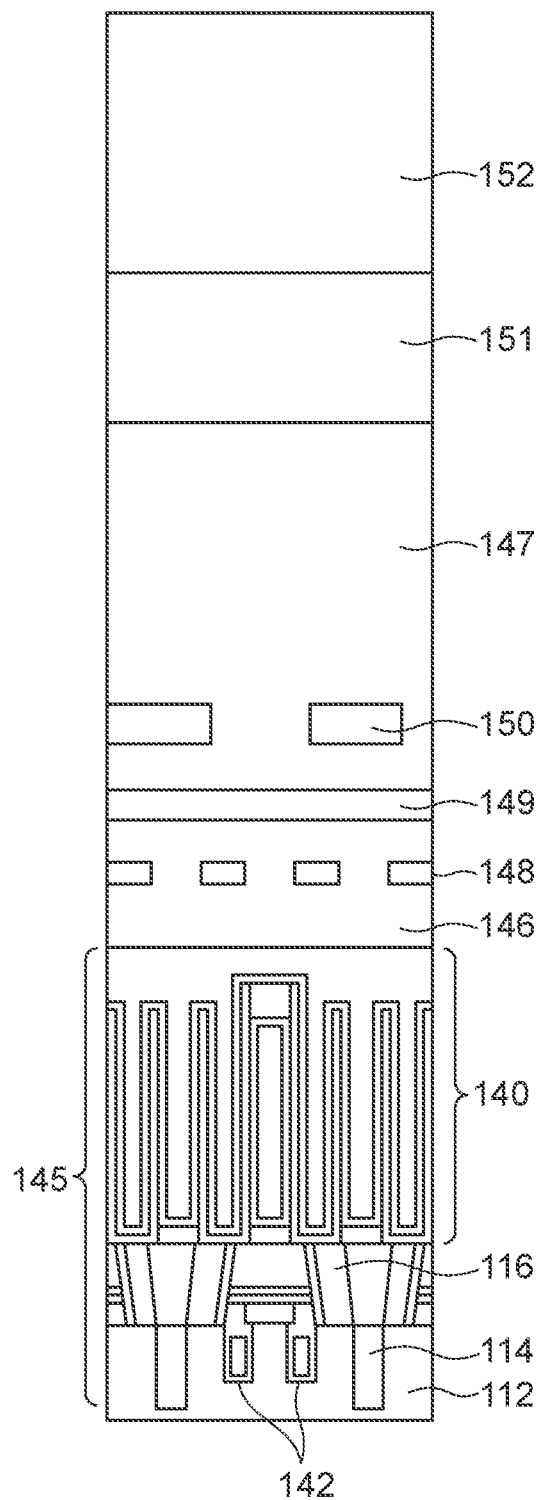
FIG. 8 is a longitudinal-sectional view showing an example of an overall schematic configuration of the memory cell region of the semiconductor memory device according to the embodiment.

FIG. 8 is a longitudinal-sectional view showing an example of an overall schematic configuration of the memory cell region of the semiconductor memory device according to the embodiment. As shown in FIG. 8, a semiconductor substrate 112, a shallow trench isolation insulating film 114, access transistors 142, a capacitance contact 116, and the like which are included in a memory cell 145 of DRAM are provided below a capacitor 140. The capacitor 140 is provided on the semiconductor substrate 112 on which the shallow trench isolation insulating film 114, the access transistors 142, the capacitance contact 116, and the like are formed. The semiconductor substrate 112 corresponds to a semiconductor substrate 10 described later.

A lower electrode of the capacitor 140 shown in FIG. 8 is electrically connected to one of the source and drain regions of the access transistor 142 formed in an active region of the semiconductor substrate 112 via the capacitance contact 116. The lower electrode of the capacitor 140 is connected to the semiconductor substrate 112. The gate electrode of the access transistor 142 corresponds to the word-line 4 in FIG. 1B, FIG. 2A, FIG. 2B and the like.

As shown in FIG. 8, an upper layer portion which includes multilevel upper wiring layers such as wirings 148, 149, 150, and 151 is provided above the capacitor 140. The upper layer portion is arranged above the memory cell 145. The upper electrode of the capacitor 140 is arranged on the multilevel upper wiring layers side such as the wirings 148, 149, 150, and 151. Elements 146, 147 and 152 shown in FIG. 8 include insulating materials.

Figure 7A:
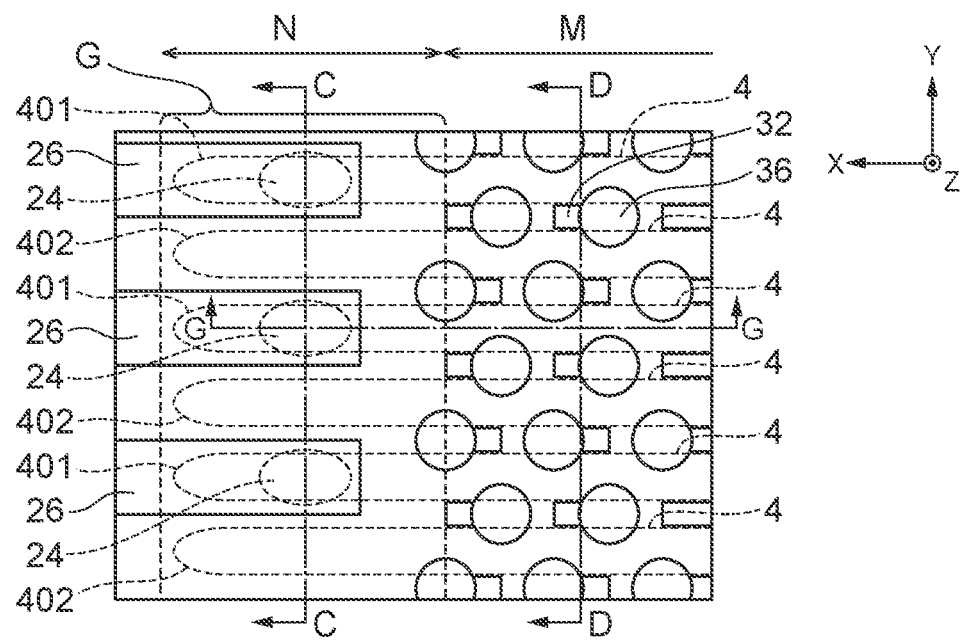
Figure 7B:
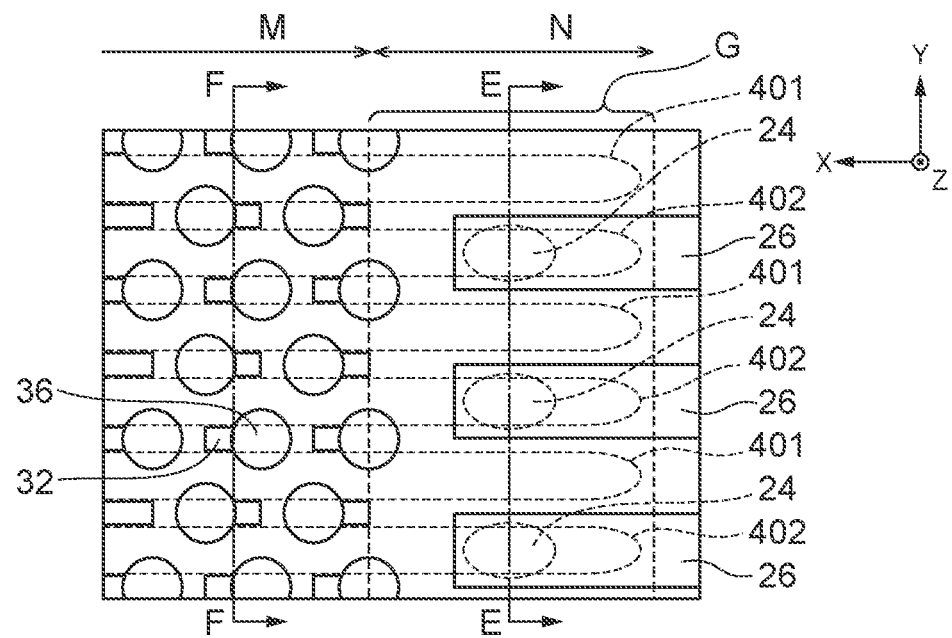
Figure 7C:
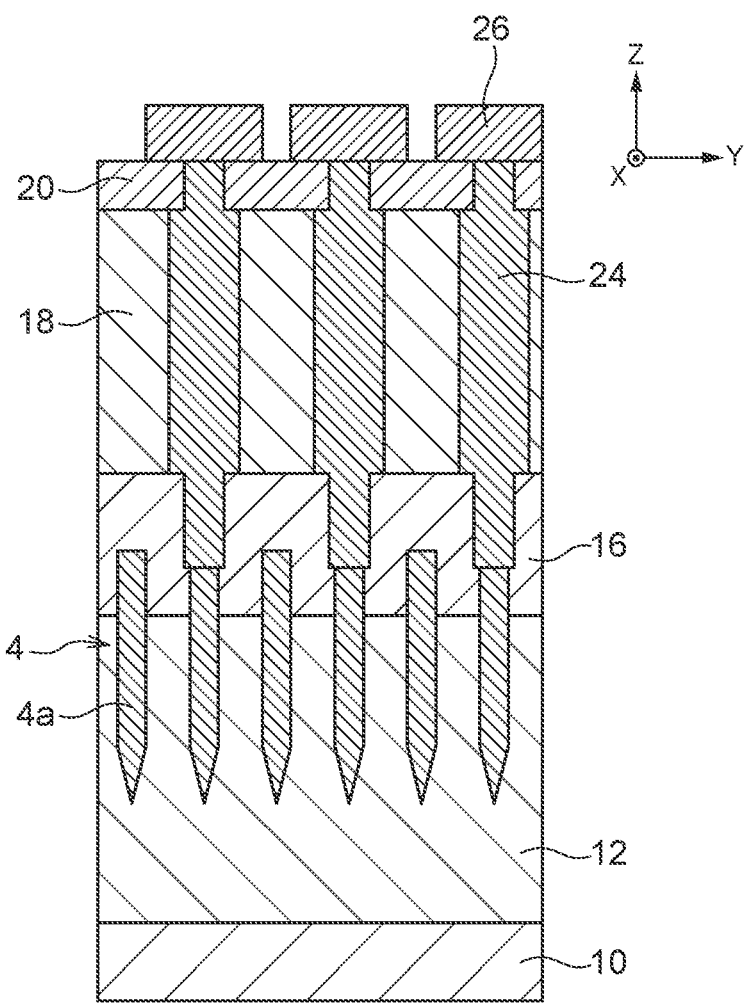
Figure 7D:
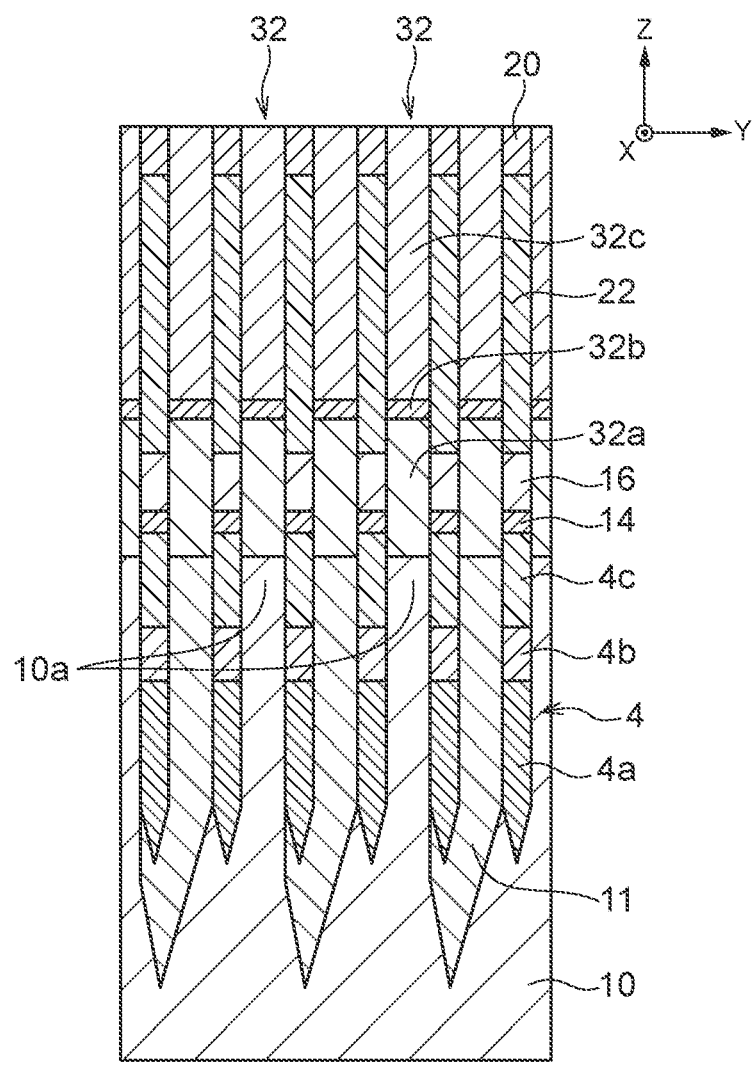
Figure 7E:
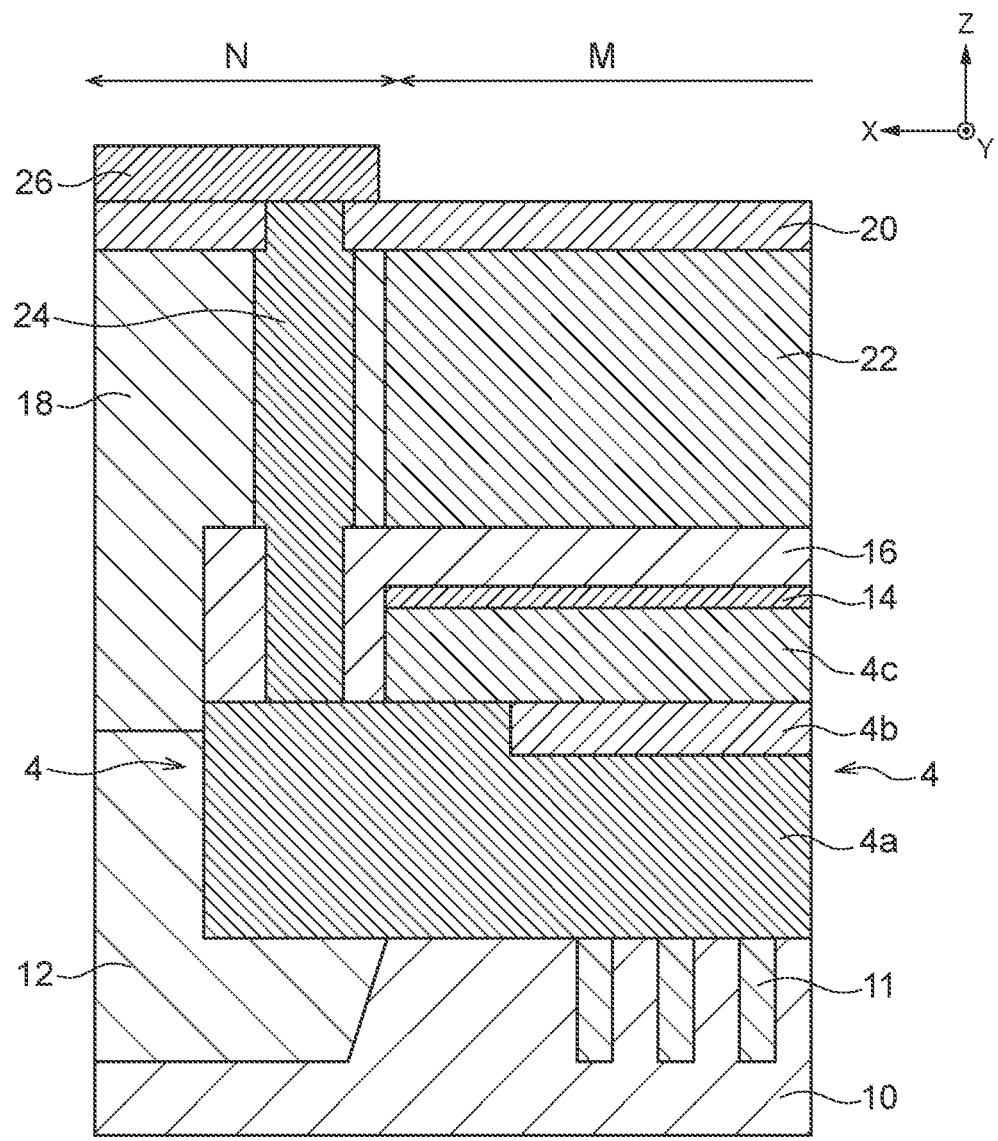

The capacitor 140 and the upper layer portion are provided on the upper side of the diagrams shown in FIGS. 7C, 7D and 7E described later as in the case of the configuration shown in FIG. 8. The capacitance contact 116 corresponds to a capacitance contact electrode 32 described later.

Figure 9:
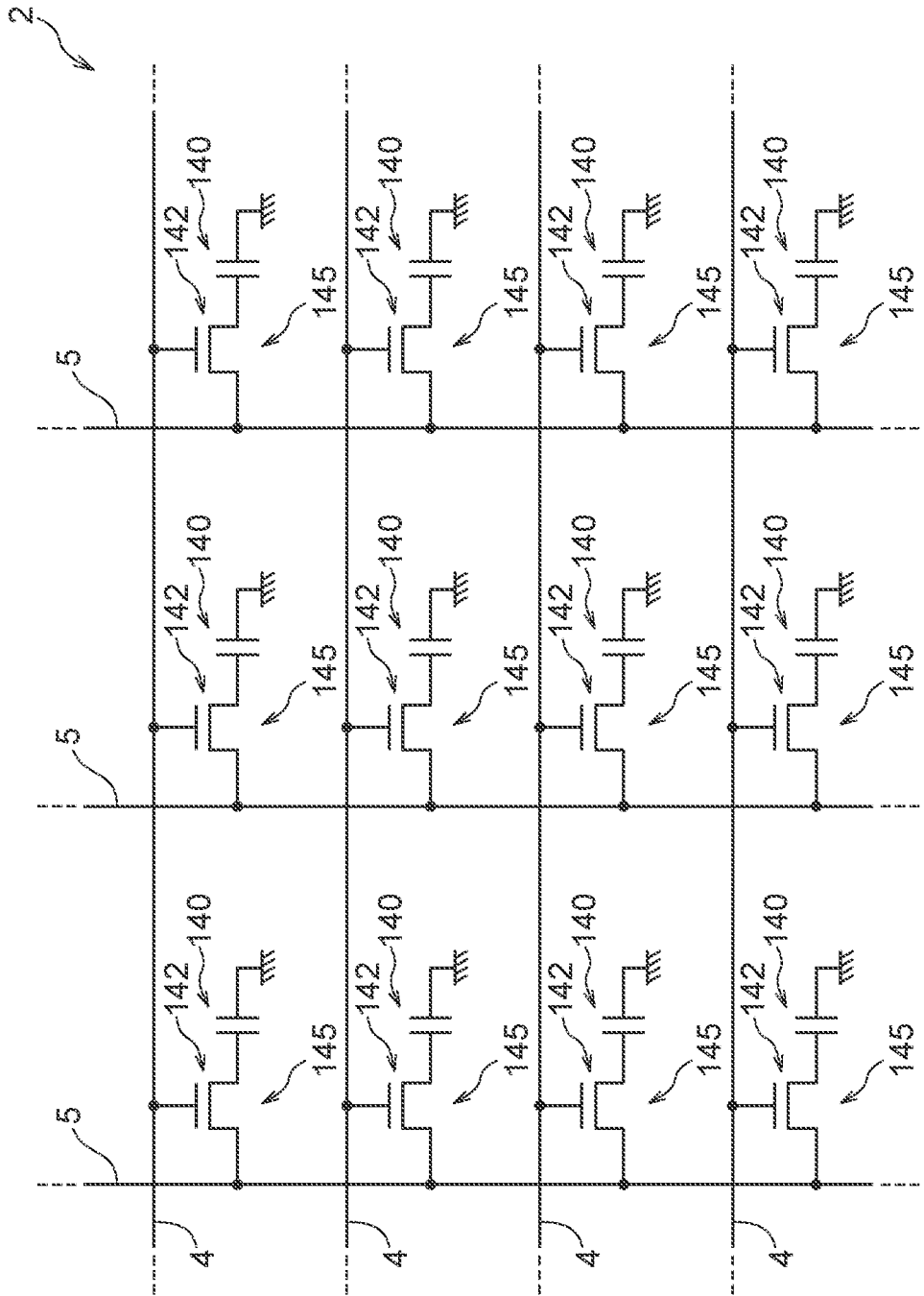
FIG. 9 is a circuit diagram showing an example of a schematic configuration of an equivalent circuit of a memory cell of the semiconductor memory device according to the embodiment.

FIG. 9 shows an equivalent circuit of a memory cell array of the semiconductor memory device according to the embodiment. Each of the plurality of memory cells 145 are arranged in a matrix form with being connected to the intersections between the plurality of word-lines 4 and the plurality of bit-lines 5 which are arranged orthogonally to each other. One memory cell 145 includes a pair of access transistors 142 and a capacitor 140.

The access transistor 142 includes, for example, a metal-oxide-semiconductor field-effect transistor (MOSFET). The gate electrode of the access transistor 142 functions as the word-line 4 of DRAM. The word-line 4 functions as a control line for controlling the selection of the corresponding memory cell. One of the source and drain of the access transistor 142 is connected to the bit-line 5, and the other is connected to the capacitor 140. The capacitor 140 includes a capacitor, and data is stored by accumulating an electric charge in the capacitor.

During data writing into the memory cell 145, a potential for turning on the access transistor 142 is applied to the word-line 4, and a low potential or a high potential which corresponds to write data "0" or "1" is applied to the bit-line 5. During data reading from the memory cell 145, a potential for turning on the access transistor 142 is applied to the word-line 4. As a result, the potential extracted from the capacitor 140 to the bit-line 5 is sensed by a sense amplifier connected to the bit-line 5, whereby the data is determined.

A method of forming the semiconductor memory device according to the embodiment will be described with reference to FIGS. 3A, 3B and 3C to FIGS. 7A, 7B, 7C, 7D and 7E. FIGS. 3A, 3B and 3C to FIGS. 7A, 7B, 7C, 7D and 7E are diagrams showing the schematic configuration of the memory mat end region A shown in FIG. 1B and FIG. 2A in process order.

Figure 3A:
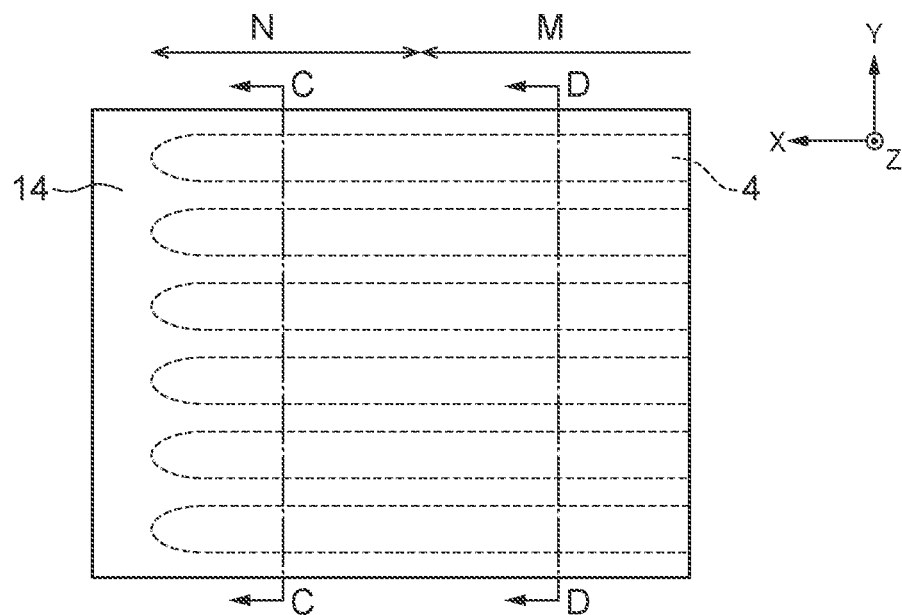
FIGS. 3A to 3C, FIGS. 4A to 4C, FIGS. 5A to 5C, FIGS. 6A to 6D, and FIGS. 7A to 7E are diagrams showing the semiconductor memory device according to the embodiment and a schematic configuration of a method of forming the same, and are diagrams showing an example of the schematic configuration in an exemplary process stage in process order.
Figure 3B:
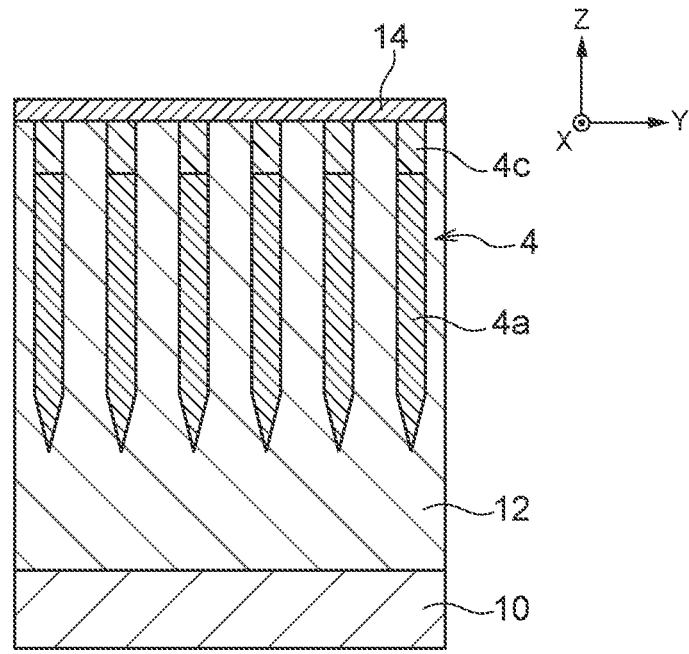
Figure 3C:
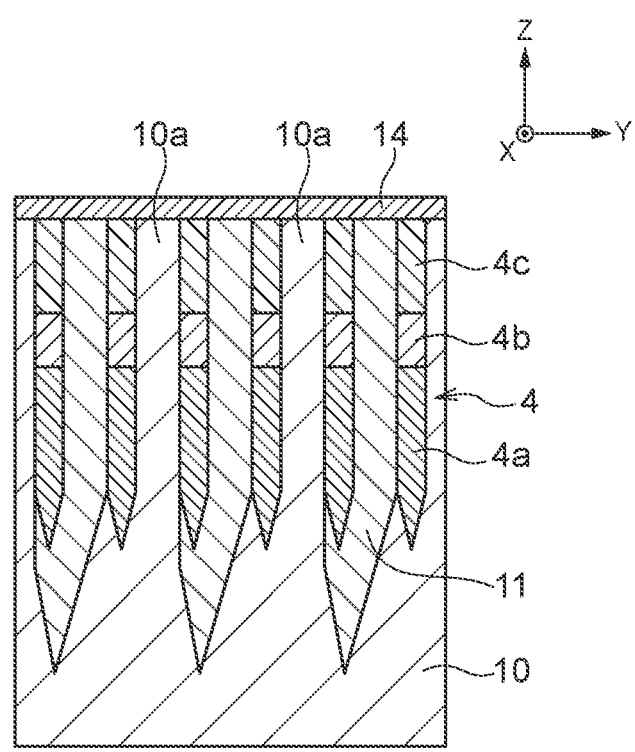

First, as shown in FIGS. 3A, 3B and 3C, in the memory cell region M, isolation insulating films 11 are formed on the semiconductor substrate 10. The active regions 10a are demarcated from one another by the isolation insulating films 11. In the peripheral region N, a peripheral isolation insulating film 12 is formed on the semiconductor substrate 10. Thereafter, trenches for forming the word-lines 4 are formed across the semiconductor substrate 10, the isolation insulating films 11, and the peripheral isolation insulating film 12.

The semiconductor substrate 10 includes, for example, a silicon single crystal substrate. The isolation insulating films 11 and the peripheral isolation insulating film 12 are formed by forming trenches in the semiconductor substrate 10 and filling an insulating material having, for example, silicon nitride (SiN), silicon dioxide ($SiO_2$), or the like in the trenches.

Thereafter, trenches for forming the word-lines 4 are formed across the semiconductor substrate 10, the isolation insulating films 11, and the peripheral isolation insulating film 12, and then a conductive material and an insulating material are filled in the trenches. In the memory cell region M, a metal portion 4a, a silicon portion 4b, and a cap portion 4c are formed in the trench from below. In the peripheral region N, a metal portion 4a and a cap portion 4c are formed in the trench from below. The word-line 4 includes the metal portion 4a and the silicon portion 4b in the memory cell region M, and includes the metal portion 4a in the peripheral region N.

The metal portion 4a includes a conductive material, and contains, for example, titanium nitride (TiN). The silicon portion 4b includes, for example, polysilicon (Poly-Si) or amorphous silicon (a-Si) doped with impurities such as phosphorus, arsenic, or boron. The cap portion 4c includes an insulating material, and contains, for example, silicon nitride. The metal portion 4a, the silicon portion 4b, and the cap portion 4c are formed by, for example, chemical vapor deposition (hereinafter referred to as "CVD"). In the memory cell region M, after forming the conductive material, etch back is performed to dig down, and then polysilicon is formed so as to backfill the dug-down portion. As a result, as shown in FIG. 7E described later, the positions of the top surfaces of the metal portions 4a in the peripheral region N and the top surfaces of the silicon portions 4b in the memory cell region M in the up-and-down direction (that is, the Z direction) substantially match each other.

The top surface of the peripheral isolation insulating film 12 and the top surface including the top surfaces of the cap portions 4c are flat. A first insulating film 14 is formed so as to cover the peripheral isolation insulating film 12 and the cap portions 4c. The word-lines 4 are covered with the isolation insulating film 12 and the insulating portions 4c and embedded. The first insulating film 14 contains, for example, silicon dioxide. The first insulating film 14 is formed by, for example, CVD.

Figure 4A:
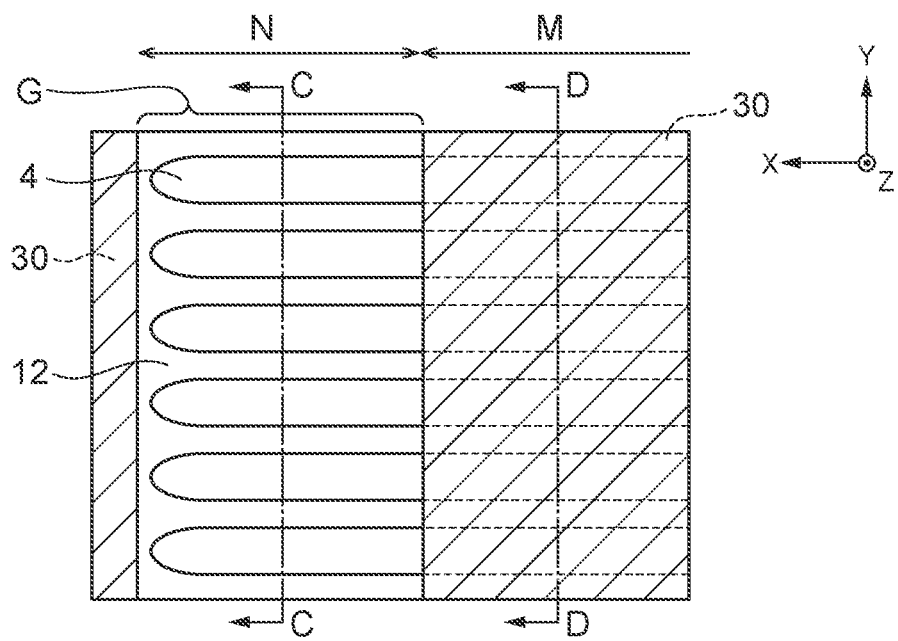
Figure 4B:
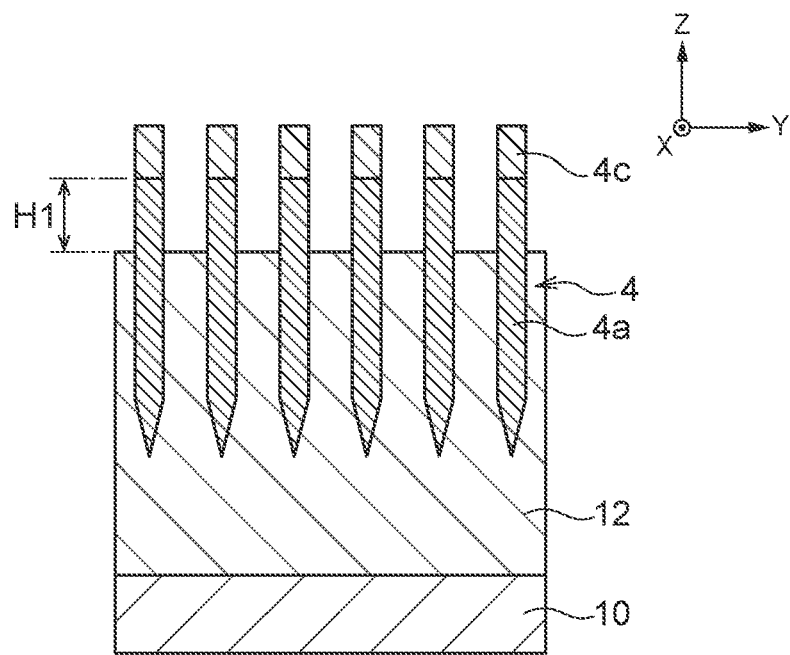
Figure 4C:
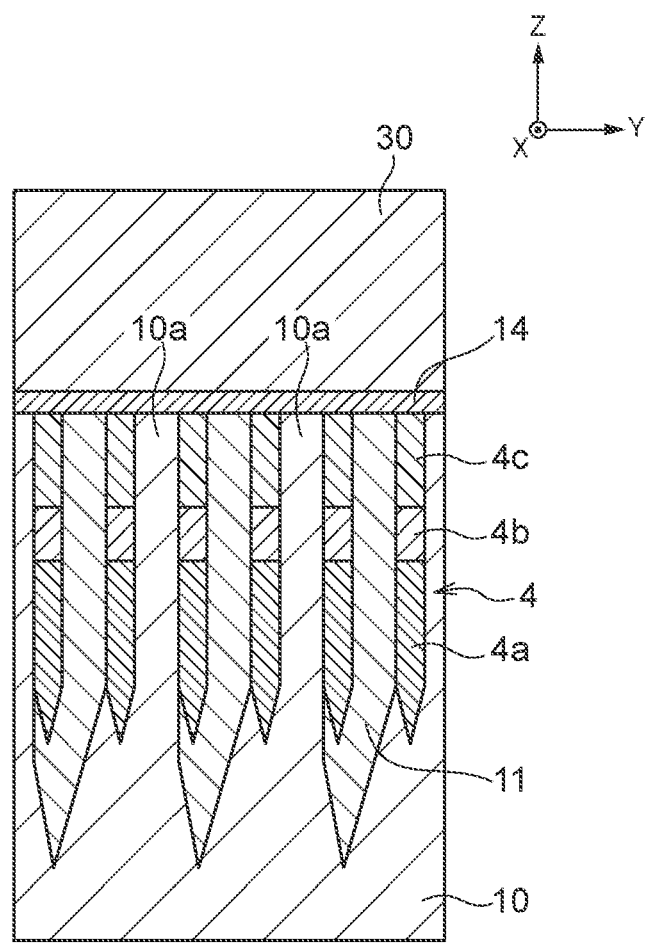

Next, as shown in FIGS. 4A, 4B and 4C, a resist 30 having an opening portion formed in the peripheral region N is formed. The resist 30 is patterned by using a known lithography technique. The memory cell region M is covered with the resist 30, but the peripheral region N is not covered with the resist 30. Next, anisotropic dry etching is performed by using the resist 30 as an etching mask to etch the peripheral isolation insulating film 12 so that the top surface of the peripheral isolation insulating film 12 is located at the height corresponding to a dig-down amount H1 by which the top surface of the peripheral isolation insulating film 12 is dug down from the top surfaces of the metal portions 4a. The anisotropic dry etching is performed under a condition that the etching rates of the cap portions 4c and the metal portions 4a are extremely lower than the etching rate of the peripheral isolation insulating film 12.

This anisotropic dry etching digs down the peripheral isolation insulating film 12, thereby exposing the top surfaces and side surfaces of the cap portions 4c and parts of the side surfaces of the upper portions of the metal portions 4a. Since the memory cell region M is covered with the resist 30, no etching is performed on the memory cell region M. In this anisotropic dry etching, the cap portions 4c may be removed to expose the upper portions of the word-lines 4. Further, isotropic dry etching may be performed instead of this anisotropic dry etching.

Figure 5A:
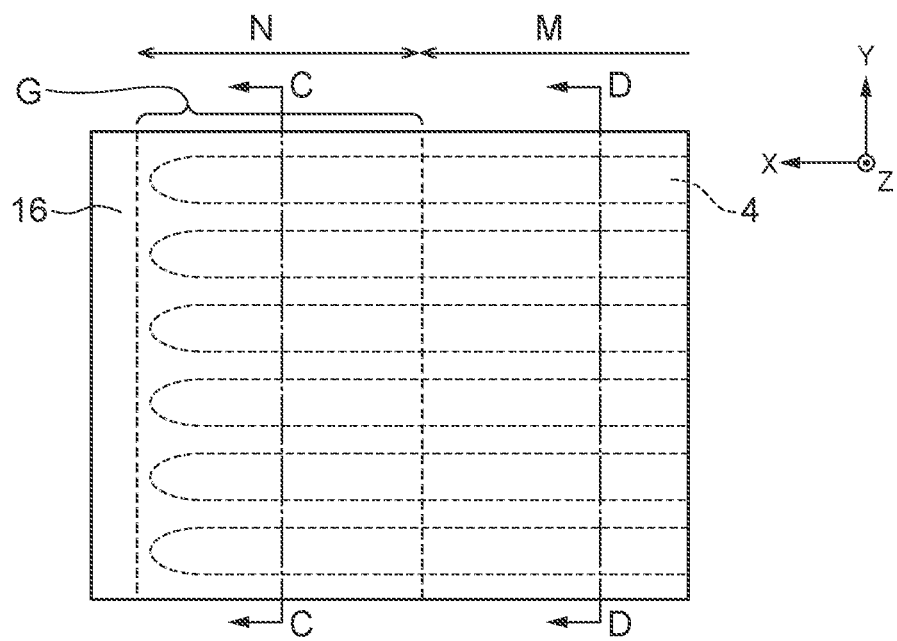
Figure 5B:
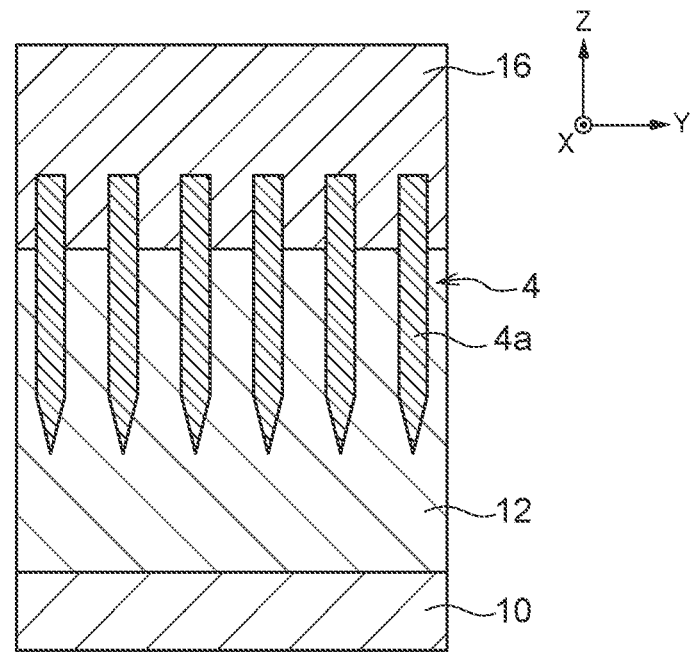
Figure 5C:
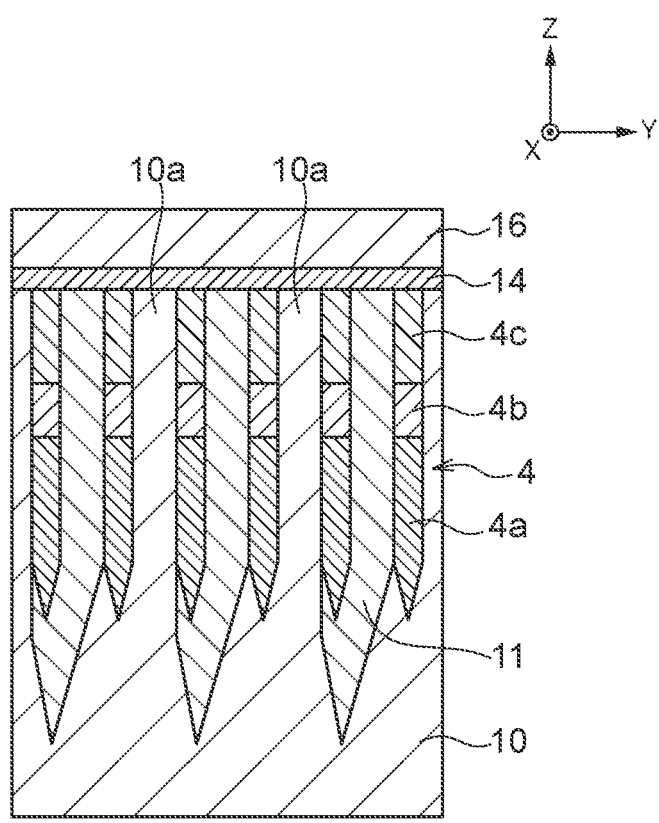

Next, as shown in FIGS. 5A, 5B and 5C, after removing the resist 30, a second insulating film 16 is formed so as to cover the top surface of the first insulating film 14 in the memory cell region M and the cap portions 4c and the upper portions of the metal portions 4a in the peripheral region N. The second insulating film 16 includes an insulating material, and contains, for example, silicon nitride. The second insulating film 16 is formed by, for example, CVD. Note that the cap portions 4c shown in FIG. 4B and the second insulating film 16 have the same material, so that the boundary lines therebetween disappear in FIG. 5B, and these elements become an integral second insulating film 16. The second insulating film 16 covers the word-lines 4 so as to come into contact with the top surfaces and side surfaces of the upper portions of the word-lines 4. In the anisotropic dry etching performed in FIGS. 4A, 4B and 4C, even when the cap portions 4c are removed, the second insulating film 16 likewise covers the word-lines 4 so as to come into contact with the top surfaces and side surfaces of the upper portions of the word-lines 4.

Next, as shown in FIGS. 6A, 6B, 6C and 6D, a third insulating film 18 and a fourth insulating film 20 are sequentially formed in the peripheral region N. Thereafter, anisotropic dry etching is performed on the fourth insulating film 20, the third insulating film 18, and the second insulating film 16 by using a known lithography technique to form word-line contact holes 8a. The third insulating film 18 includes an insulating material, and contains, for example, silicon dioxide. The fourth insulating film 20 includes an insulating material, and contains, for example, silicon nitride. third insulating film 18 and the fourth insulating film 20 are formed by, for example, CVD.

In the peripheral region N, the word-line contact holes 8a are arranged on alternate word-lines 4. The word-line contact holes 8a pass through the fourth insulating film 20, the third insulating film 18, and a part of the second insulating film 16, and the upper ends of the word-lines 4 are exposed at the lower ends of the word-line contact holes 8a.

Figure 6A:
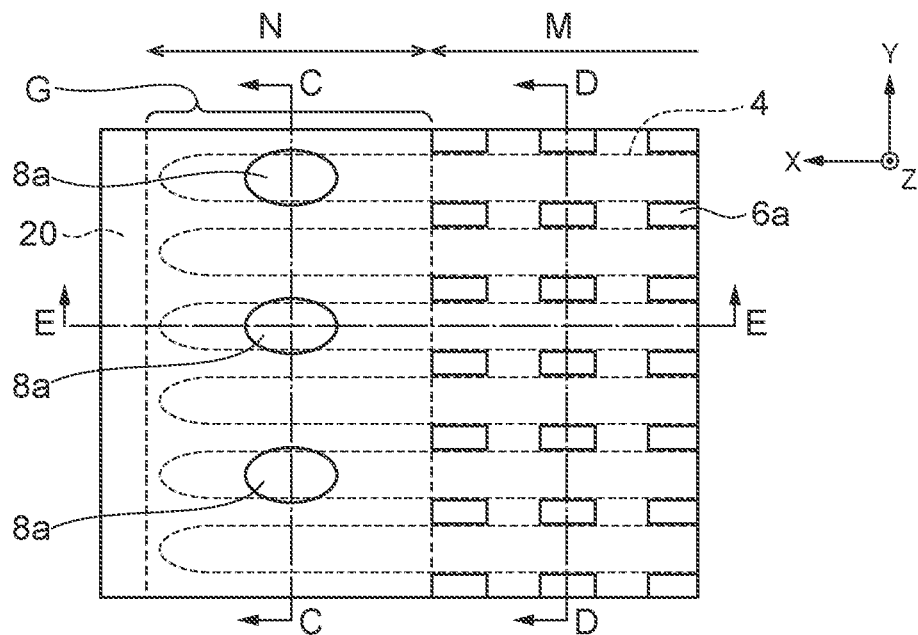
Figure 6B:
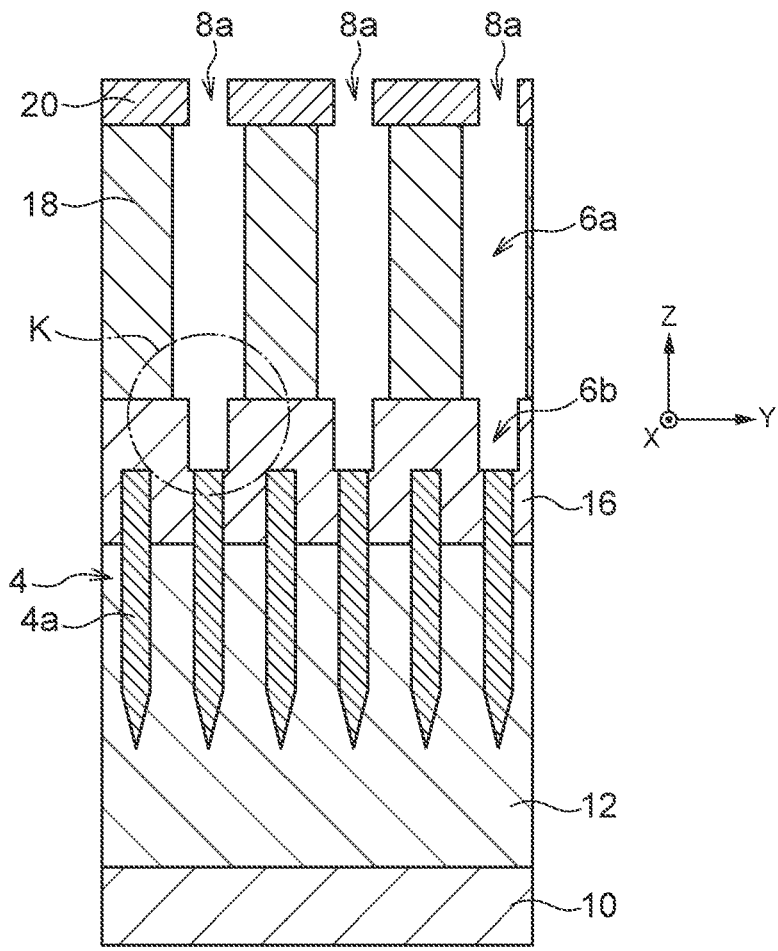
Figure 6C:
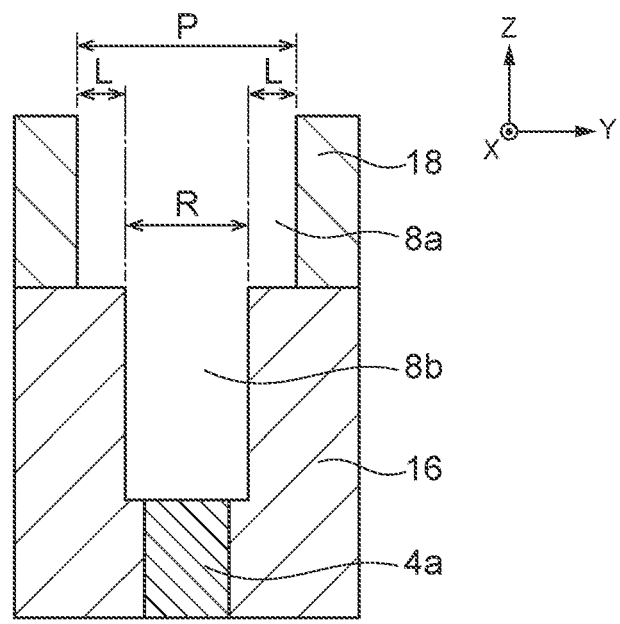

Next, a pretreatment is carried out in order to remove natural oxides formed on the metal portions 4a. The pretreatment is carried out by using, for example, buffered hydrogen fluoride (hereinafter referred to as "BHF", buffered hydrofluoric acid). By this pretreatment, the third insulating film 18 containing silicon dioxide is etched, and the inner diameter (diameter) in a lateral direction of the word-line contact holes 8a in the third insulating film 18 is increased by a dimension L as shown in FIG. 6C. Since the second insulating film 16 containing silicon nitride is hardly etched by the pretreatment, the dimension of the inner diameter of the word-line contact holes 8a in the second insulating film 16 is not substantially increased. The dimension P of the word-line contact holes 8a in the third insulating film 18 is larger than the dimension R of the word-line contact holes 8a in the second insulating film 16. The dimension P (diameter) in the lateral direction, that is, the Y direction of the portions of the word-line contact holes 8a which pass through the third insulating film 18 is smaller than the dimension R (diameter) in the lateral direction, that is, the Y-direction of the portions of the word-line contact holes 8a which pass through the second insulating film 16.

As described above, the periphery of the word-line contact hole 8a is covered with the second insulating film 16 containing silicon nitride at the lower part 6b of the word-line contact hole 8a. Therefore, even when the pretreatment is performed by using BHF, the dimension in the lateral direction of the word-line contact holes 8a does not increase. Therefore, it is possible to suppress the connection between adjacent word-line contact holes 8a. As a result, even when a conductive material is filled in the word-line contact holes 8a in a subsequent step, adjacent word-line contacts 8 are not short-circuited.

Figure 6D:
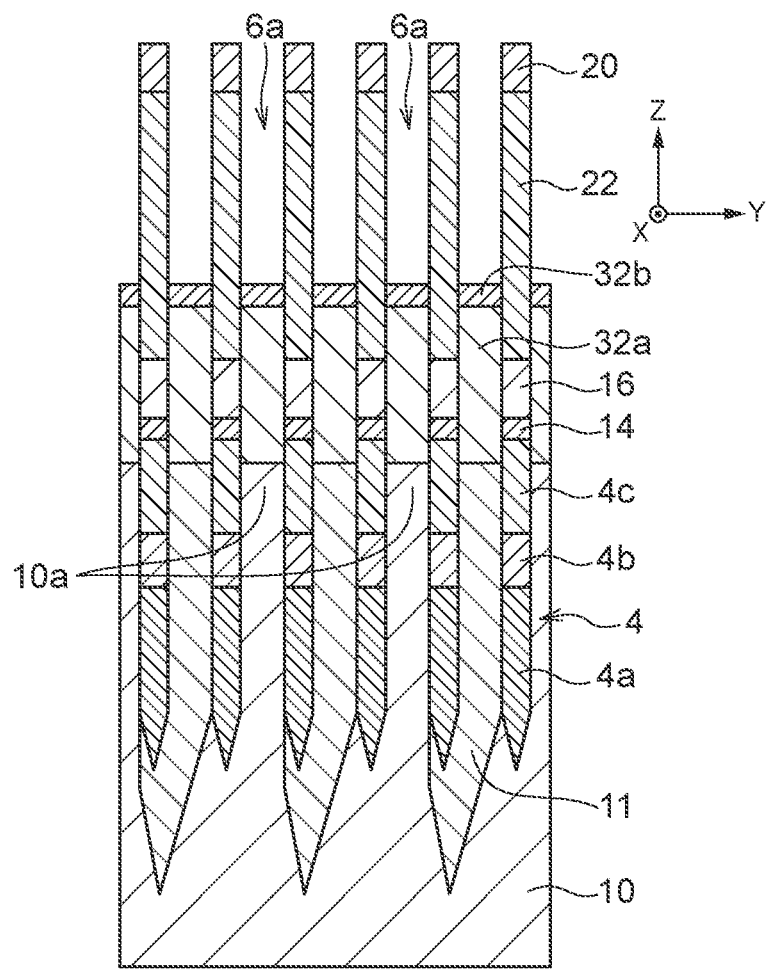

As shown in FIG. 6D, a fifth insulating film 22 and a fourth insulating film 20 are sequentially formed on the second insulating film 16 in the memory cell region M. The fifth insulating film 22 includes an insulating material, and contains, for example, silicon nitride. The fifth insulating film 22 is formed by, for example, CVD. The fifth insulating film 22 is patterned by using a known lithography technique and an anisotropic dry etching technique, and is formed only in the memory cell region M. The fourth insulating film 20 is the same film as the fourth insulating film 20 shown in FIG. 6C, and is formed at the same time in the memory cell region M and the peripheral region N. Next, capacitance contact holes 6a reaching the top surfaces of the active regions 10a are formed by using the known lithography technique and the anisotropic dry etching technique.

Next, first electrode portions 32a containing polysilicon doped with impurities are formed at lower parts of the capacitance contact holes 6a. The first electrode portions 32a are formed by forming polysilicon in the capacitance contact holes 6a, for example, by using CVD, and performing etch-back by anisotropic dry etching so that polysilicon remains in about the lower halves of the capacitance contact holes 6a. Subsequently, second electrode portions 32b are formed on the first electrode portions 32a. The second electrode portion 32b includes, for example, a conductive material, and contains, for example, a metal silicide such as titanium nitride (TiN) or cobalt silicide (CoSi). In the above-described embodiment, an example in which the word-line contact holes 8a are formed first and then the capacitance contact holes 6a are formed is shown. However, the embodiment is not limited to this manner. The capacitance contact holes 6a may be formed first, and then the word-line contact holes 8a may be formed.

Next, as shown in FIGS. 7A, 7B, 7C, 7D, and 7E, a conductive material is formed in the word-line contact holes 8a, in the capacitance contact holes 6a, on the top surface of the fourth insulating film 20, and on the top surface of the fifth insulating film 22. Next, the conductive material is etched back until the top surface of the fourth insulating film 20 and the top surface of the fifth insulating film 22 are exposed. For example, a film of tungsten is formed as the conductive material. The film of the conductive material is formed by, for example, CVD. Etch-back is performed by using, for example, anisotropic or isotropic dry etching. As a result, the word contact electrodes 24 are embedded in the word-line contact holes 8a, and third electrode portions 32c are embedded in the capacitance contact holes 6a. The first electrode portion 32a, the second electrode portion 32b, and the third electrode portion 32c serve as the capacitance contact electrode 32. At this time, the diameter of a portion of the word contact electrode 24 which is surrounded by the third insulating film 18 is smaller than the diameter of a portion of the word contact electrode 24 which is surrounded by the second insulating film 16.

Next, a conductive material is formed on the word contact electrodes 24, the fourth insulating film 20, the capacitance contact electrodes 32, and the fifth insulating film 22 by, for example, CVD, and then conductive material is patterned by using a known lithography technique and anisotropic dry etching. As a result, peripheral wirings 26 connected to the word contact electrodes 24 and pedestal electrodes 36 connected to the capacitance contact electrodes 32 are formed. The peripheral wirings 26 and the pedestal electrodes 36 contain, for example, tungsten.

The peripheral wirings 26 are connected to a row decoder (not shown). A row address to be selected at the time of reading or writing for a memory cell is input from a row address buffer (not shown) to the row decoder. Each of the plurality of word-lines 4 is paired with a corresponding one of the plurality of memory cells to control access to a plurality of corresponding memory cells out of the plurality of memory cells. Capacitors 140 are connected to the pedestal electrodes 36 in a later step.

Through the above steps, the semiconductor memory device 1 according to the embodiment has been formed.

The process step for the peripheral region N and the process step for the memory cell region M can be carried out by different process steps, or can be carried out by a common process step. For example, when the process step is carried out on the peripheral region N, a mask is formed on the memory cell region M, and when the process step is carried out on the memory cell region M, a mask is formed on the peripheral region N. As a result, different process steps can be carried out on the peripheral region N and the memory cell region M. For example, a resist, an insulating material, a conductive material, or the like can be used as the mask.

In the description of the above embodiment, an example in which the word contact electrodes 24 and the third electrode portions 32c are formed in the same process step is disclosed, but they may be formed in different process steps. Further, an example in which the peripheral wirings 26 and the pedestal electrodes 36 are formed in the same process step is disclosed, but they may be formed in different process steps.

As described above, the upper portions of the word-lines 4 are covered with the second insulating film 16 in the peripheral region N. The upper portions of the word-lines 4 are covered with the second insulating film 16 while being in contact with the second insulating film 16. The second insulating film 16 includes an insulating material whose material is different from that of the third insulating film 18. As a result, in the peripheral region N, the top surfaces and the side surfaces of the upper portions of the word-lines 4 are covered with the second insulating film 16 including the nitride film. As a result, it is possible to prevent the opening size of the word-line contact holes 8a from increasing in the vicinity of the upper portions of the word-lines 4 due to the pretreatment when the word-line contact holes 8a are expanded.

For example, BHF is used in the pretreatment when the word-line contact holes 8a are expanded. The etching rate of the second insulating film 16 by BHF is extremely lower than the etching rate of the third insulating film 18. Therefore, the execution of the pretreatment makes it possible to suppress expansion of the word-line contact holes 8a and thus suppress exposure of the upper portions of word-lines 4 adjacent thereto. Therefore, it is possible to suppress occurrence of a short circuit between adjacent word-lines 4. As a result, the manufacturing yield of the semiconductor memory device 1 can be improved, and the reliability of the semiconductor memory device 1 can be enhanced.

As described above, the semiconductor memory device 1 according to the embodiment has been described by exemplifying DRAM. However, this is an example and is not intended to be limited to DRAM. As the semiconductor memory device 1, memory devices other than DRAM, for example, memory devices such as a static random access memory (SRAM), a flash memory, an erasable programmable read only memory (EPROM), a magneto-resistive random access memory (MRAM), a phase-change memory may be applied.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
   a substrate;
   a memory cell region provided over the substrate;
   a peripheral region provided over the substrate and adjacent to the memory cell region;
   a plurality of word-lines extending in parallel across the memory cell region and the peripheral region;
   a first insulating film covering top surfaces of the plurality of word-lines in each of the memory cell region and the peripheral region and covering side surfaces of upper portions of the plurality of word-lines in the peripheral region without covering side surfaces of the upper portions of the plurality of word-lines in the memory cell region; and
   a third insulating film between the first insulating film and the top surfaces of the plurality of word-lines in the memory cell region.

2. An apparatus comprising:
   a substrate;
   a memory cell region provided over the substrate;
   a peripheral region provided over the substrate and adjacent to the memory cell region;
   a plurality of word-lines extending in parallel across the memory cell region and the peripheral region;
   a first insulating film covering top surfaces of the plurality of word-lines in each of the memory cell region and the peripheral region and covering side surfaces of upper portions of the plurality of word-lines in the peripheral region without covering side surfaces of the upper portions of the plurality of word-lines in the memory cell region; and
   a second insulating film over the first insulating film in the peripheral region; and
   a plurality of word-line-contacts each connected to a corresponding one of the plurality of word-lines passing through the first and second insulating films in the peripheral region;
   wherein each of the plurality of word-line contacts including an upper portion surrounded by the second insulating film and a lower portion surrounded by the first insulating film, and
   wherein the lower portion has a smaller diameter than that of the upper portion.

3. The apparatus of claim 2, wherein the first insulating film comprises a material different from that of the second insulating film.

4. The apparatus of claim 2, wherein the first insulating film comprises silicon nitride, and the second insulating film comprises silicon dioxide.

* * * * *